(12) United States Patent
Nakashima et al.

(10) Patent No.: US 6,313,052 B1
(45) Date of Patent: *Nov. 6, 2001

(54) GLASS FOR A SUBSTRATE

(75) Inventors: Tetsuya Nakashima; Kei Maeda; Yasumasa Nakao, all of Yokohama (JP)

(73) Assignee: Asahi Glass Company Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/256,213

(22) Filed: Feb. 24, 1999

(30) Foreign Application Priority Data

Feb. 27, 1998 (JP) .................................................. 10-048096

(51) Int. Cl.$^7$ .............................. C03C 3/085; C03C 3/087
(52) U.S. Cl. ................................ 501/69; 501/70; 501/72
(58) Field of Search .................................. 501/69, 70, 72

(56) References Cited

U.S. PATENT DOCUMENTS

| | | |
|---|---|---|
| 5,348,916 | 9/1994 | Kushitani et al. . |
| 5,599,754 | 2/1997 | Maeda et al. . |
| 5,631,195 | 5/1997 | Yanagisawa et al. . |
| 5,780,373 | 7/1998 | Yanagisawa et al. . |
| 5,854,153 * | 12/1998 | Kohli ....................................... 501/70 |
| 5,858,897 | 1/1999 | Maeda et al. . |
| 5,888,917 * | 3/1999 | Kawaguchi et al. ................... 501/69 |
| 5,900,296 * | 5/1999 | Hayashi et al. ........................ 501/70 |
| 5,908,794 * | 6/1999 | Maeda et al. .......................... 501/72 |
| 5,925,583 * | 7/1999 | Yoshii et al. ........................... 501/72 |
| 6,087,284 * | 7/2000 | Brix et al. .............................. 501/69 |

FOREIGN PATENT DOCUMENTS

| | | |
|---|---|---|
| 0 795 522 | 9/1997 | (EP) . |
| 853 070 * | 9/1998 | (EP) . |
| 3-170343 | 7/1991 | (JP) . |
| 6-024790 * | 2/1994 | (JP) . |
| 7-257937 | 10/1995 | (JP) . |
| 8-133771 * | 5/1996 | (JP) . |
| 8-290939 * | 11/1996 | (JP) . |
| 9-249430 | 9/1997 | (JP) . |
| 9-301733 | 11/1997 | (JP) . |
| 9-301732 * | 11/1997 | (JP) . |
| 10-025130 * | 1/1998 | (JP) . |
| 10-072235 * | 3/1998 | (JP) . |
| 98/40320 * | 9/1998 | (WO) . |

OTHER PUBLICATIONS

Patent Abstracts of Japan, AN 09158821, vol. 098 No. 008, Jun. 1998, JP 10–072235.

* cited by examiner

Primary Examiner—David R Sample
(74) Attorney, Agent, or Firm—Oblon, Spivak, McClelland, Maier & Neustadt, P.C.

(57) ABSTRACT

A glass for a substrate, having an average thermal expansion coefficient in the range of from $60\times10^{-7}$ to $75\times10^{-7}$/° C. at 50 to 350° C., which consists essentially of the following composition expressed by wt %:

| | wt % |
|---|---|
| $SiO_2$ | more than 62 to 74, |
| $Al_2O_3$ | 1 to 15, |
| MgO | 0 to 9, |
| CaO | 0 to 14, |
| $Na_2O$ | 0 to 12, |
| $K_2O$ | 0 to 13, |
| $SiO_2 + Al_2O_3$ | 72 to 82, |
| MgO + CaO | 5 to 24, |
| $Na_2O + K_2O$ | 1 to 15, |
| $MgO + CaO + Na_2O + K_2O$ | 18 to 28. |

10 Claims, No Drawings

GLASS FOR A SUBSTRATE

The present invention relates to a glass used as a substrate for a flat display such as a field emission display (FED), a plasma display panel (PDP) or the like, and also as a substrate for a solar cell.

Various display systems have been developed with regard to a flat display, and among them, a notable one is a self-luminescent system display wherein electrodes are formed on a front face glass substrate and a back face glass substrate and a phosphor is excited to emit light by using an electron beam or discharge generated between the two substrates. Typical examples include FED and PDP.

Various systems have been proposed with regard to FED, and all of them employ a system of irradiating an electron beam generated at an electrode on a back face substrate towards a transparent electrode on a front face substrate and exciting a phosphor patterned on the transparent electrode to emit light. Since it is necessary to maintain the irradiation space in a vacuum state in the same manner as in a cathode ray tube, the front face glass substrate and the back face glass substrate are fixed so as to face to each other and its surrounding is frit-sealed and evacuated to vacuum, and a mixed gas of Xe—Ne is charged therein.

It is common in both systems of FED and PDP (1) to form a transparent electrode directly on a front face glass substrate and (2) to frit-seal the surrounding of a front face glass substrate and a back face glass substrate fixed so as to face to each other. ITO ($In_2O_3$:Sn) or $SnO_2$ is usually used as the transparent electrode.

Also, a solar cell which is a clean energy source is greatly expected as an energy source of next generation. Particularly, a thin film type solar cell using amorphous silicon has been recently noticeable since a solar cell can be produced at a relatively low cost.

Since a solar cell is used often outdoors, its substrate is required to be transparent to light and abrasion-resistant, and soda lime silica glass excellent in these properties is now used. In this case also, a transparent electrode such as $SnO_2$ is formed on a glass substrate.

With regard to glass used as a substrate for a flat display such as FED, PDP or the like, there is known a glass having a high strain point and an improved heat resistance in addition to a soda lime silica glass having an average thermal expansion coefficient (hereinafter simply referred to as "thermal expansion coefficient") of $85 \times 10^{-7}/°$ C. at 50 to 350° C. For example, JP-A-7-257937 discloses a glass composition consisting essentially of from 56 to 60 wt % of $SiO_2$, from 10 to 16 wt % of $Al_2O_3$, from 1 to 4 wt % of $ZrO_2$, from 0 to 3 wt % of $TiO_2$, from 0 to 4 wt % of MgO, from 3 to 9 wt % of CaO, from 0 to 4 wt % of SrO, from 2 to 8 wt % of BaO, from 0 to 3 wt % of ZnO, from 3 to 7 wt % of $Na_2O$, from 5 to 10 wt % of $K_2O$ and at most 16 wt % of MgO+CaO+SrO+BaO+ZnO, and the glass illustrated in the Example has a thermal expansion coefficient of from $77.3 \times 10^{-7}$ to $87.3 \times 10^{-7}/°$ C.

However, ITO or $SnO_2$ used as a transparent electrode has a thermal expansion coefficient of about $40 \times 10^{-7}/°$ C., while glass has a thermal expansion coefficient of at least $77 \times 10^{-7}/°$ C. Thus, a thermal expansion coefficient difference between the two materials is large. For this reason, there are problems that the transparent electrode formed on the glass substrate is separated (peeled) or causes cracks due to expansion or shrinkage caused by temperature change.

On the other hand, there is known a low expansion glass having a thermal expansion coefficient of at most $50 \times 10^{-7}/°$ C., which is used as a substrate for a liquid crystal display. For example, U.S. Pat. No. 5,348,916 discloses an alkali-free glass comprising $SiO_2$, $Al_2O_3$, $B_2O_3$, MgO, CaO, SrO and BaO as the essential components, and the glass illustrated in the Example disclosed therein has a thermal expansion coefficient of from $34 \times 10^{-7}$ to $49 \times 10^{-7}/°$ C. In this case, an expansion coefficient difference between the glass and a transparent electrode is small, and there is less fear of raising problems of causing separation of the transparent electrode or cracks in the transparent electrode. However, a frit material suitable for frit-sealing two sheets of substrates of such a low expansion glass is a frit material for sealing an alumina ceramic substrate, for example, but such a frit material requires a very high baking temperature, at which there is a fear that a material of forming picture elements is subjected to chemical change or softened to flow.

In addition, there is known a glass having a thermal expansion coefficient of from $60 \times 10^{-7}$ to $75 \times 10^{-7}/°$ C., which is used as a substrate for PDP or the like.

JP-A-3-170343 discloses a glass composition having a strain point of at least 680° C., a glass softening point of at least 900° C. and a thermal expansion coefficient of from $60 \times 10^{-7}$ to $75 \times 10^{-7}/°$ C., which consists essentially of from 52 to 65 wt % of $SnO_2$, from 1 to 10 wt % of $Al_2O_3$, from 30 to 45 wt % of MgO+CaO+SrO+BaO, from 0.5 to 6 wt % of $ZrO_2$, from 0 to 3 wt % of $SnO_2$+$Tio_2$, from 0 to 0.5 wt % of $SO_3$+$As_2O_3$+$Sb_2O_3$, and from 0 to 5 wt % of $La_2O_3$.

JP-A-9-249430 discloses a glass composition for a substrate, which consists essentially of from 56 to 65 wt % of $SiO_2$, from more than 15 to 23 wt % of $Al_2O_3$, from 0 to 7 wt % of MgO, from 0 to 8 wt % of CaO, from 4 to 15 wt % of MgO+Cao, from 0 to 9 wt % of $Na_2O$, from 0 to 11 wt % of $K_2O$, from 8 to less than 12 wt % of $Na_2O$+$K_2O$ and from 0 to 2 wt % of $ZrO_2$.

Further, D263 of Schott and #0211 of Corning Incorporated are known to be a glass having a thermal expansion coefficient of about $72 \times 10^{-7}/°$ C. for a substrate.

If these glasses are used as a substrate, there is less fear of raising problems of causing separation of a transparent electrode or cracks in the transparent electrode since a thermal expansion coefficient difference between the glasses and the transparent electrode is relatively small. Also, in the case of using these glasses, it is possible to conduct frit-sealing without using a frit material requiring a high baking temperature. However, the glass disclosed in JP-A-3-170343 has a high specific gravity, and it is difficult to lighten elements. Actually, all of the glasses illustrated in the Examples disclosed therein have specific gravities of at least 2.9 calculated by mathematical model of glass composition-physical property, which exceeds the upper limit value 2.6 of a preferable specific gravity. Also, the glass disclosed in JP-A-9-249430 has a high $Al_2O_3$ content of exceeding 15 wt %, and raises a problem of corroding an $Al_2O_3$—$ZrO_2$—$SiO_2$ type electrocast brick or an $Al_2O_3$ type electrocast brick at a part in direct contact with molten glass in a glass melting furnace. Further, each of D263 of Schott and #0211 of Corning Incorporated has a high ZnO content of at least 6 wt %, and consequently, there is a fear of causing devitrification in a case of carrying out formation by float process.

On the other hand, as a substrate for a solar cell, soda lime silica glass is conventionally used. However, soda lime silica glass contains alkali oxides such as $Na_2O$, $K_2O$ and the like in a total amount of 14.5 wt %, and these alkali components are diffused into a transparent electrode or into amorphous silicon through the transparent electrode, thereby deteriorating performances of a solar cell. Further, when soda lime silica glass is used outdoors for a long term, the alkali components in the glass and moisture in air cause "stain" phenomenon, thereby lowering transparency and raising problems of causing separation of the transparent electrode. Still further, due to a large expansion coefficient difference between the glass and the transparent electrode, the transparent electrode is separated (peeled) or cracks occur in the transparent electrode.

It is an object of the present invention to solve the above-mentioned problems and to provide a glass for a substrate, which is float-formable and which does not corrode an electrocast brick for melting glass.

Thus, the present invention provides a glass for a substrate, having an average thermal expansion coefficient in the range of from $60 \times 10^{-7}$ to $75 \times 10^{-7}/°$ C. at 50 to 350° C., which consists essentially of the following composition expressed by wt %:

| | wt % |
|---|---|
| $SiO_2$ | more than 62 to 74, |
| $Al_2O_3$ | 1 to 15, |
| MgO | 0 to 9, |
| CaO | 0 to 14, |
| $Na_2O$ | 0 to 12, |
| $K_2O$ | 0 to 13, |
| $SiO_2 + Al_2O_3$ | 72 to 82, |
| MgO + CaO | 5 to 24, |
| $Na_2O + K_2O$ | 1 to 15, |
| MgO + CaO + $Na_2O$ + $K_2O$ | 18 to 28. |

The glass of the present invention is typically used as a substrate for a flat display such as FED, PDP or the like. A transparent electrode is formed on the substrate, and the transparent electrode is coated with a low melting glass. A coating with the low melting glass is usually carried out by preparing a paste of a low melting glass frit, coating the paste and then baking.

The glass of the present invention has an average thermal expansion coefficient (hereinafter simply referred to as "thermal expansion coefficient") in the range of from $60 \times 10^{-7}$ to $75 \times 10^{-7}/°$ C. at 50 to 350° C. If the thermal expansion coefficient is lower than $60 \times 10^{-7}/°$ C., a thermal expansion coefficient difference between a transparent electrode and a low melting point glass frit to be coated becomes too large, and there is a fear of causing cracks or separation of the low melting point glass coating layer. Thus, the thermal expansion coefficient is preferably at least $6 \times 10^{-7}/°$ C. If the thermal expansion coefficient is higher than $75 \times 10^{-7}/°$ C., a thermal expansion coefficient difference between the glass and the transparent electrode becomes too large, there is a fear of causing cracks or separation of the transparent electrode. Thus, the thermal expansion coefficient is preferably at most $74 \times 10^{-7}/°$ C.

The glass of the present invention preferably has a specific gravity of less than 2.6. If the specific gravity is not less than 2.6, it becomes difficult to lightening elements of a flat display. Thus, the specific gravity is more preferably at most 2.55.

The glass of the present invention preferably has a temperature (hereinafter referred to as "formation temperature") of at most 1,300° C., at which a viscosity becomes $10^4$ poises. If the formation temperature exceeds 1,300° C., a temperature to form the glass of the present invention becomes too high, and it becomes difficult to form the glass. Also, when the glass of the present invention is formed by float process, a float bath temperature becomes too high, and evaporation of molten tin in the float bath becomes too much. As this result, a tin concentration in the atmosphere in the float bath becomes too high, and tin in the atmosphere is condensated and tin defects generated on a glass ribbon surface in the float bath increases. Thus, the formation temperature is preferably at most 1,270° C., more preferably at most 1,250° C.

The glass of the present invention preferably has a glass transition temperature of at least 620° C. If the glass transition temperature is lower than 620° C., a substrate using this glass causes deformation, shrinkage and the like when it is subjected to heat treatment, and it becomes difficult to accurately combine with a transparent electrode formed on an opposed substrate at an accurate position. Thus, the glass transition temperature is preferably at least 630° C.

On the other hand, the glass of the present invention preferably has a glass transition temperature of at most 700° C. If the glass transition temperature is higher than 700° C., a glass ribbon temperature at the outlet of a float bath becomes too high when the glass of the present invention is formed by float process, and causes a problem of increasing an amount of molten tin deposited from the glass ribbon onto a conveying roll positioned at the downstream of the float bath. As this result, there is a fear that the molten tin deposited on the conveying roll degrade the quality of the product thus obtained. Thus, the glass transition temperature of the glass of the present invention is preferably at most 690° C., more preferably at most 680° C.

A liquidus temperature of the glass of the present invention is preferably not higher than the formation temperature. If the liquidus temperature of the glass of the present invention is higher than the formation temperature, there is a fear that the glass is devitrified in the glass melting furnace or at the formation by float process. The liquidus temperature is preferably 20° C. lower than the formation temperature, more preferably 40° C. lower than the formation temperature.

The glass of the present invention consists essentially of the following composition expressed by wt %:

| | |
|---|---|
| $SiO_2$ | more than 62 to 74, |
| $Al_2O_3$ | 1 to 15, |
| MgO | 0 to 9, |
| CaO | 0 to 14, |
| $Na_2O$ | 0 to 12, |
| $K_2O$ | 0 to 13, |
| $SiO_2 + Al_2O_3$ | 72 to 82, |
| MgO + CaO | 5 to 24, |
| $Na_2O + K_2O$ | 1 to 15, |
| MgO + CaO + $Na_2O$ + $K_2O$ | 18 to 28. |

The glass of the present invention consists essentially of preferably the following composition expressed by wt %:

| | |
|---|---|
| $SiO_2$ | more than 62 to 74, |
| $Al_2O_3$ | 3 to 15, |
| MgO | 0 to 7, |
| CaO | 0 to 13, |
| $Na_2O$ | 0 to 10, |
| $K_2O$ | 0 to 11, |
| $SiO_2 + Al_2O_3$ | 72 to 82, |
| MgO + CaO | 5 to 20, |
| $Na_2O + K_2O$ | 3 to 14, |
| MgO + CaO + $Na_2O$ + $K_2O$ | 13 to 28. |

The glass of the present invention more preferably consists essentially of the following composition expressed by wt %:

| | |
|---|---|
| $SiO_2$ | 65 to 73, |
| $Al_2O_3$ | 5 to 12, |
| MgO | 1 to 5, |
| CaO | 2 to 11, |
| $Na_2O$ | 2 to 8, |
| $K_2O$ | 2 to 10, |
| $SiO_2 + Al_2O_3$ | 74 to 81, |
| MgO + CaO | 6 to 15, |
| $Na_2O + K_2O$ | 5 to 13.5, |
| $MgO + CaO + Na_2O + K_2O$ | 18.5 to 25. |

The glass of the present invention consists essentially of most preferably the following composition expressed by wt %:

| | |
|---|---|
| $SiO_2$ | 68 to 72, |
| $Al_2O_3$ | 6 to 10, |
| MgO | 2 to 4, |
| CaO | 4 to 10, |
| $Na_2O$ | 4 to 6, |
| $K_2O$ | 4 to 9, |
| $SiO_2 + Al_2O_3$ | 76 to 80, |
| MgO + CaO | 7 to 13, |
| $Na_2O + K_2O$ | 7 to 13, |
| $MgO + CaO + Na_2O + K_2O$ | 19 to 23. |

The grounds of the limitation of the composition of the glass of the present invention are described below, and "wt %" is expressed simply by "%" hereinafter.

$SiO_2$ is an essential component for forming the essential structure of glass. If the amount of $SiO_2$ is less than 62%, heat resistance and chemical durability are lowered. Thus, the amount of $SiO_2$ is preferably at least 65%, more preferably at least 68%. On the other hand, if the amount of $SiO_2$ exceeds 74%, a thermal expansion coefficient is lowered. Thus, the amount of $SiO_2$ is preferably at most 73%, more preferably at most 72%.

$Al_2O_3$ improves chemical durability, and is an essential component for reducing "stain". If the amount of $Al_2O_3$ is less than 1%, its effect is small. Thus, the amount of $Al_2O_3$ is preferably at least 3%, more preferably at least 5%, most preferably at least 6%. If the amount of $Al_2O_3$ exceeds 15%, there is a fear that corrosion to $Al_2O_3$—$ZrO_2$—$SiO_2$ type electrocast brick or $Al_2O_3$ type electrocast brick becomes severe, and the formation temperature becomes too high to satisfactorily carry out float formation. Thus, the amount of $Al_2O_3$ is preferably at most 12%, more preferably at most 10%.

If the total amount of $SiO_2$ and $Al_2O_3$ is less than 72%, heat resistance and chemical durability are lowered. Thus, the total amount of $SiO_2$ and $Al_2O_3$ is preferably at least 74%, more preferably at least 76%. On the other hand, if the total amount of $SiO_2$ and $Al_2O_3$ exceeds 82%, a thermal expansion coefficient is lowered, and the formation temperature becomes too high. Thus, the total amount of $SiO_2$ and $Al_2O_3$ is preferably at most 81%, more preferably at most 80%.

Each of MgO and CaO is not an essential component, but in order for lowering a viscosity of molten glass to accelerate melting, MgO may be contained in an amount of at most 9% and CaO may be contained in an amount of at most 14%. If the amounts of MgO and CaO exceed these upper limits, a thermal expansion coefficient of the glass becomes too high, and a liquidus temperature also becomes too high. Thus, the amount of MgO is preferably at most 7%, more preferably at most 5%, most preferably at most 4%, and the amount of CaO is preferably at most 13%, more preferably at most 11%, most preferably at most 10%. Further, in order for lowering a viscosity of molten glass to accelerate melting, it is preferable to add MgO and CaO in respective amounts of at least 1% and at least 2%, more preferably respectively at least 2% and at least 4%.

If the total amount of MgO and CaO is less than 5%, a viscosity of molten glass becomes too high, and the glass is hardly meltable. Thus, the total amount of MgO and CaO is preferably at least 6%, more preferably at least 7%. On the other hand, if the total amount of MgO and CaO exceeds 24%, a thermal expansion coefficient becomes too large and a liquidus temperature becomes too high. Thus, the total amount of MgO and CaO is preferably at most 20%, more preferably at most 15%.

Each of $Na_2O$ and $K_2O$ is not an essential component, but they may be contained in amounts respectively of at most 12% and at most 13% in order for lowering a viscosity of molten glass to accelerate melting. If the amounts of these components exceed the above-mentioned upper limits, the thermal expansion coefficient of the glass becomes too large, and chemical durability is lowered. Thus, the amounts of these components are respectively preferably at most 10% and at most 11%, more preferably at most 8% and at most 10%. Also, each of $Na_2O$ and $K_2O$ is contained in each amount of preferably at least 2%, more preferably at least 4%.

If the total amount of $Na_2O$ and $K_2O$ is less than 1%, a viscosity of molten glass becomes too high, and the glass becomes hardly meltable. Thus, the total amount of $Na_2O$ and $K_2O$ is preferably at least 3%, more preferably at least 5%, most preferably at least 7%. On the other hand, if the total amount of $Na_2O$ and $K_2O$ is 15%, the thermal expansion coefficient of the glass becomes too large, and chemical durability is lowered. Thus, the total amount of $Na_2O$ and $K_2O$ is preferably at most 14%, more preferably at most 13.5%.

If the total amount of MgO, CaO, $Na_2O$ and $K_2O$ is less than 18%, a viscosity of molten glass becomes too high, and the glass becomes hardly meltable. Thus, the total amount is preferably at least 18.5%, more preferably at least 19%. On the other hand, if the total amount exceeds 28%, the thermal expansion coefficient becomes too large, and a liquidus temperature becomes too high and chemical durability is lowered. Thus, the total amount is preferably at most 25%, more preferably at most 23%.

The glass of the present invention substantially consists essentially of the above-mentioned components, but may further contain the following components in a total amount of at most 5%.

Thus, the glass of the present invention may further contain a refining agent such as $SO_3$, $As_2O_3$, $Sb_2O_3$ and the like in a total amount of at most 1%, a coloring agent such as $Fe_2O_3$, NiO, CoO and the like in a total amount of at most 2%, and $TiO_2$, $CeO_2$ or the like for preventing electron beam browning in a total amount of at most 2%.

Also, SrO, BaO and ZnO may be contained respectively in each amount of at most 2% and in a total amount of at most 2%, in order to achieve the same effect as CaO and MgO. If each amount of SrO and BaO exceeds 2%, there is a fear that the specific gravity of the glass becomes too large. Also, if the amount of ZnO exceeds 2%, there is a fear that a liquidus temperature becomes too high.

Also, $Li_2O$ may be contained in an amount of at most 1%, in order to achieve the same effect as $Na_2O$ and $K_2O$. However, if the amount of $Li_2O$ exceeds 1%, there is a fear that a glass transition temperature becomes too low.

Also, in order for lowering a viscosity of molten glass to accelerate melting, $B_2O_3$ may be contained in an amount of at most 1%. If the amount of $B_2O_3$ exceeds 1%, there is a fear that a glass transition temperature becomes too low.

Further, in order to raise the glass transition temperature, $ZrO_2$ may be contained in an amount of at most 2%. If the amount of $ZrO_2$ exceeds 2%, there is a fear that the specific gravity of the glass becomes too high.

A method for producing the glass of the present invention is not specially limited, and various production methods can be employed. For example, raw materials usually used are blended so as to obtain a target composition, and the composition is heated and melted in a glass melting furnace. Glass is homogenized by bubbling, addition of a refining agent, stirring or other means, and the glass is formed into a predetermined plate thickness by a well known method such as press method, down draw method, float method or the like, and was slowly cooled, and was subjected to processing treatments such as grinding, polishing and the like to obtain a substrate having predetermined size and shape.

EXAMPLES

With regard to Examples 1 to 4, starting materials of respective components were blended so as to prepare such target compositions as shown by wt % in the following Table, and were melted in a platinum crucible at 1,550 to 1,650° C. for 4 hours, and molten glass was cast into a plate-like product and was then gradually cooled. During melting for 4 hours, the molten glass was stirred by a platinum stirrer to homogenize glass.

With regard to Examples 1 and 2, respective physical properties as shown in the following Table were measured. With regard to Examples 3 and 4, a liquidus temperature only was measured, and other respective physical properties were calculated in accordance with a mathematical model of glass composition-physical property. The liquidus temperatures of Examples 3 and 4 were lower than 1,200° C.

With regard to Examples 5 to 19, respective physical properties were calculated in accordance with a mathematical model of glass composition-physical property.

Examples 1 to 19 illustrate Examples of the present invention, and Examples 20 to 24 illustrate Comparative Examples. Example 20 illustrates soda lime silica glass, Example 21 illustrates glass disclosed in JP-A-3-170343, and Examples 22 to 24 illustrate glasses disclosed in JP-A-9-249430.

Respective physical properties shown in the following Table were measured in accordance with the following methods.

Specific Gravity

Using a glass block of about 20 g containing no bubble, a specific gravity was measured by an Archimedes method.
Thermal Expansion Coefficient (Unit: $\times 10^{-7}/° C.$):

By means of a differential thermal expansion meter and using a quartz glass as a reference sample, elongation of a glass was measured when it was heated from room temperature at a rate of 5° C./min. The measurement was continued to a temperature (yield point) at which elongation was no longer observed even when the glass was softened, and an average linear thermal expansion coefficient within a range of from 50 to 350° C. was calculated.
Glass Transition Temperature (Unit: ° C.)

A bending point in a thermal expansion curve obtained when measuring the above thermal expansion coefficient was taken as a glass transition temperature.
Formation Temperature (Unit: ° C.)

A temperature at which a viscosity of molten glass reached $10^4$ poises was measured by a rotating viscometer.
Licuidus Temperature (Unit: ° C.)

Glass was pulverized into glass particles having a particle size of about 2 mm in a mortar, and the glass particles were placed in a platinum boat and were heat-treated for 24 hours in a temperature-gradient furnace. The maximum temperature of glass particles precipitating a crystal was taken as a liquidus temperature.

TABLE 1

| Examples | 1 | 2 | 3 | 4 | 5 | 6 | 7 | 8 | 9 | 10 |
|---|---|---|---|---|---|---|---|---|---|---|
| $SiO_2$ | 70.4 | 70.7 | 69.8 | 70.7 | 64.7 | 66.1 | 66.6 | 67.7 | 69.1 | 69.4 |
| $Al_2O_3$ | 8.2 | 8.1 | 8.9 | 6.6 | 13.1 | 9.8 | 12.7 | 12.9 | 9.9 | 10.0 |
| MgO | 3.2 | 2.6 | 3.5 | 3.9 | 3.9 | 3.9 | 0.0 | 1.3 | 3.4 | 3.9 |
| CaO | 7.2 | 6.2 | 5.4 | 7.2 | 10.8 | 10.7 | 10.5 | 10.7 | 10.8 | 9.1 |
| $Na_2O$ | 5.0 | 4.9 | 4.9 | 4.0 | 6.0 | 2.0 | 5.8 | 5.9 | 6.8 | 6.1 |
| $K_2O$ | 6.0 | 7.5 | 7.5 | 7.6 | 1.5 | 7.5 | 4.4 | 1.5 | 0.0 | 1.5 |
| $SiO_2 + Al_2O_3$ | 78.6 | 78.8 | 78.7 | 77.3 | 77.8 | 75.9 | 79.3 | 80.6 | 79.0 | 79.4 |
| MgO + CaO | 10.4 | 8.8 | 8.9 | 11.1 | 14.7 | 14.6 | 10.5 | 12.0 | 14.2 | 13.0 |
| $Na_2O + K_2O$ | 11.0 | 12.4 | 12.4 | 11.6 | 7.5 | 9.5 | 10.2 | 7.4 | 6.8 | 7.6 |
| $MgO + CaO + Na_2O + K_2O$ | 21.4 | 21.2 | 21.3 | 22.7 | 22.2 | 24.1 | 20.7 | 19.4 | 21.0 | 20.6 |
| Specific gravity | 2.45 | 2.44 | 2.45 | 2.47 | 2.50 | 2.50 | 2.47 | 2.47 | 2.49 | 2.48 |
| Thermal expansion coefficient | 71 | 74 | 73 | 73 | 70 | 72 | 72 | 66 | 67 | 67 |
| Glass transition temperature | 645 | 635 | 647 | 651 | 656 | 676 | 641 | 649 | 642 | 649 |
| Formation temperature | 1230 | 1235 | 1240 | 1245 | 1247 | 1266 | 1267 | 1285 | 1239 | 1256 |
| Liquidus temperature | 1185 | 1175 | | | | | | | | |

TABLE 2

| Examples | 11 | 12 | 13 | 14 | 15 | 16 | 17 | 18 | 19 |
|---|---|---|---|---|---|---|---|---|---|
| $SiO_2$ | 69.5 | 70.5 | 62.2 | 71.2 | 71.9 | 71.7 | 72.3 | 72.5 | 68.9 |
| $Al_2O_3$ | 10.0 | 6.7 | 14.0 | 3.3 | 9.0 | 6.7 | 6.7 | 7.3 | 4.0 |
| MgO | 3.9 | 4.0 | 3.0 | 3.9 | 3.9 | 4.0 | 4.0 | 4.0 | 4.9 |
| CaO | 11.0 | 11.1 | 9.8 | 10.9 | 9.1 | 11.0 | 9.2 | 11.1 | 11.6 |
| $Na_2O$ | 4.0 | 6.1 | 1.0 | 0.0 | 4.5 | 2.0 | 6.1 | 3.5 | 3.0 |
| $K_2O$ | 1.6 | 1.6 | 10.0 | 10.7 | 1.6 | 4.6 | 1.7 | 1.6 | 7.6 |
| $SiO_2 + Al_2O_3$ | 79.5 | 77.2 | 76.2 | 74.5 | 80.9 | 78.4 | 79.0 | 79.8 | 72.9 |
| MgO + CaO | 14.9 | 15.1 | 12.8 | 14.8 | 13.0 | 15.0 | 13.2 | 15.1 | 16.5 |
| $Na_2O + K_2O$ | 5.6 | 7.7 | 11.0 | 10.7 | 6.1 | 6.6 | 7.8 | 5.1 | 10.6 |
| MgO + CaO + $Na_2O$ + $K_2O$ | 20.5 | 22.8 | 23.8 | 25.5 | 19.1 | 21.6 | 21.0 | 20.2 | 27.1 |
| Specific gravity | 2.48 | 2.50 | 2.49 | 2.49 | 2.46 | 2.47 | 2.47 | 2.47 | 2.52 |
| Thermal expansion coefficient | 62 | 69 | 74 | 71 | 61 | 63 | 66 | 60 | 75 |
| Glass transition temperature | 667 | 640 | 690 | 675 | 661 | 673 | 641 | 666 | 655 |
| Formation temperature | 1286 | 1214 | 1298 | 1250 | 1296 | 1287 | 1239 | 1288 | 1190 |
| Liquidus temperature | | | | | | | | | |

TABLE 3

| Examples | 20 | 21 | 22 | 23 | 24 |
|---|---|---|---|---|---|
| $SiO_2$ | 72.5 | 63.0 | 64.3 | 63.5 | 64.4 |
| $Al_2O_3$ | 1.0 | 2.0 | 16.7 | 18.8 | 19.1 |
| MgO | 2.5 | 0.5 | 3.8 | 0.0 | 4.8 |
| CaO | 9.5 | 7.0 | 5.7 | 7.1 | 0.0 |
| SrO | 0.0 | 18.5 | 0.0 | 0.0 | 0.0 |
| BaO | 0.0 | 8.0 | 0.0 | 0.0 | 0.0 |
| $ZrO_2$ | 0.0 | 1.0 | 0.0 | 0.0 | 0.0 |
| $Na_2O$ | 14.0 | 0.0 | 3.7 | 4.2 | 4.7 |
| $K_2O$ | 0.5 | 0.0 | 5.7 | 6.4 | 7.1 |
| $SiO_2 + Al_2O_3$ | 73.5 | 65.0 | 81.0 | 82.3 | 83.5 |
| MgO + CaO | 12.0 | 7.5 | 9.5 | 7.1 | 4.8 |
| $Na_2O + K_2O$ | 14.5 | 0.0 | 9.4 | 10.6 | 11.8 |
| MgO + CaO + $Na_2O$ + $K_2O$ | 26.5 | 7.5 | 18.9 | 17.7 | 16.6 |
| Specific gravity | 2.5 | 2.88 | 2.47 | 2.45 | 2.41 |
| Thermal expansion coefficient | 87 | 63 | 64 | 69 | 66 |
| Glass transition temperature | 550 | 740 | 716 | 736 | 746 |
| Formation temperature | 1040 | 1190 | 1329 | 1367 | 1393 |
| Liquidus temperature | 1000 | 1165 | 1225 | 1190 | 1295 |

By using the glass of the present invention as a substrate, a transparent electrode formed on the substrate hardly causes separation and cracks, and consequently reliability of a flat display, a solar cell or the like is improved. Since the glass of the present invention has a small specific gravity, it is possible to achieve lightening of elements of a flat display, a solar cell or the like. Further, the substrate hardly causes a change in size during heat treatment, and can be easily combined with an opposed transparent electrode at an accurate position. Still further, the glass of the present invention hardly causes "stain", and the substrate made of the glass of the present invention satisfactorily maintains performances of a solar cell for a longer term.

Also, the glass for a substrate of the present invention achieves various effects in the production process, e.g. to prolong the life of a glass melting furnace since the glass of the present invention is less corrosive to an electrocast brick, to enable a mass production by float process, to prevent occurrence of tin defects since it is not necessary to excessively heat a float bath to a high temperature, to prevent tin from being deposited onto a conveying roll positioned at the downstream of a float bath, thereby preventing occurrence of tin defects, and to prevent product defects caused by devitrified material since the glass of the present invention is hardly devitrifiable.

What is claimed is:

1. A glass for a substrate, the glass having an average thermal expansion coefficient in a range of from $60 \times 10^{-7}$ to $74 \times 10^{-7}/°$ C. at 50 to 350° C. and a specific gravity of at most 2.55, wherein the glass consists essentially of the following composition expressed in wt %:

| | |
|---|---|
| $SiO_2$ | 66.1 to 74 |
| $Al_2O_3$ | 7.3 to 12.7 |
| MgO | 0 to 9 |
| CaO | 0 to 14 |
| $Na_2O$ | 0 to 12 |
| $K_2O$ | 0 to 10.7 |
| $SiO_2 + Al_2O_3$ | 74 to 82 |
| MgO + CaO | 5 to 24 |
| $Na_2O + K_2O$ | 1 to 12.4 |
| MgO + CaO + $Na_2O$ + $K_2O$ | 18 to 25.5. |

2. The glass according to claim 1, wherein the glass consists essentially of:

| | |
|---|---|
| $SiO_2$ | 66.1 to 74 |
| $Al_2O_3$ | 7.3 to 12.7 |
| MgO | 0 to 9 |
| CaO | 0 to 14 |
| $Na_2O$ | 0 to 12 |
| $K_2O$ | 0 to 10.7 |
| $SiO_2 + Al_2O_3$ | 74 to 81 |
| MgO + CaO | 5 to 24 |
| $Na_2O + K_2O$ | 1 to 12.4 |
| MgO + CaO + $Na_2O$ + $K_2O$ | 18 to 25.5 |

3. The glass according to claim 1, wherein the glass consists essentially of:

| | |
|---|---|
| $SiO_2$ | 66.1 to 74 |
| $Al_2O_3$ | 7.3 to 12.7 |
| MgO | 1 to 4 |
| CaO | 2 to 11 |
| $Na_2O$ | 2 to 12 |
| $K_2O$ | 0 to 10.7 |
| $SiO_2 + Al_2O_3$ | 74 to 82 |
| MgO + CaO | 5 to 24 |
| $Na_2O + K_2O$ | 1 to 12.4 |
| $MgO + CaO + Na_2O + K_2O$ | 18 to 25.5. |

4. The glass according to claim 1, wherein the glass consists essentially of:

| | |
|---|---|
| $SiO_2$ | 66.1 to 74 |
| $Al_2O_3$ | 7.3 to 10 |
| MgO | 0 to 9 |
| CaO | 0 to 14 |
| $Na_2O$ | 0 to 12 |
| $K_2O$ | 0 to 10.7 |
| $SiO_2 + Al_2O_3$ | 74 to 82 |
| MgO + CaO | 5 to 24 |
| $Na_2O + K_2O$ | 1 to 12.4 |
| $MgO + CaO + Na_2O + K_2O$ | 18 to 25.5. |

5. The glass according to claim 1, wherein the glass is part of a field emission display.

6. The glass according to claim 1, wherein the glass is part of a plasma display panel.

7. The glass according to claim 1, wherein a viscosity of the glass is $10^4$ at a temperature of at most 1300° C.

8. The glass according to claim 1, wherein a liquidus temperature of the glass is not higher than a temperature at which a viscosity of glass is $10^4$ poise.

9. The glass according to claim 1, wherein a glass transition temperature of the glass is at least 640° C.

10. A method of making a glass, the method comprising melting raw materials, and forming the glass of claim 1.

* * * * *